United States Patent

Whitten

[15] 3,643,173

[45] Feb. 15, 1972

[54] TUNEABLE MICROELECTRONIC ACTIVE BAND-PASS FILTER

[72] Inventor: James Robert Whitten, Scotia, N.Y.

[73] Assignee: General Electric Company

[22] Filed: May 18, 1970

[21] Appl. No.: 38,019

[52] U.S. Cl. ....................................330/26, 330/28, 330/31, 330/35, 330/107, 330/109

[51] Int. Cl. ............................................................H03f 1/38

[58] Field of Search ......................330/21, 31, 35, 38 M, 107, 330/109, 26, 28; 331/142, 140

[56] References Cited

UNITED STATES PATENTS

| | | | |
|---|---|---|---|
| 2,173,426 | 9/1939 | Scott | 330/109 X |
| 3,356,962 | 12/1967 | Morgan | 330/109 X |
| 3,311,756 | 3/1967 | Nagata et al. | 330/35 X |

OTHER PUBLICATIONS

Butler, "Transistor R-C Oscillators and Selective Amplifiers" *Wireless World,* December 1962, pp. 583-589 331-110

Estep, "New Applications for IC Active Filters," *EEE,* October 1969, pp. 60-63

Haagen, "FET Varies Q of Tuned Circuit by Several Thousand," *Electronics,* Sept. 29, 1969, p. 95 330-35

Dahlem, "Industrial Applications of Linear ICs," *The Electronic Engineer,* June 1967, pp. 72-77 330-30 D

*Primary Examiner*—Roy Lake
*Assistant Examiner*—James B. Mullins
*Attorney*—Paul A. Frank, John F. Ahern, Julius J. Zaskalicky, Donald R. Campbell, Frank L. Neuhauser, Oscar B. Waddell and Joseph E. Forman

[57] ABSTRACT

A microelectronic or integrated circuit active band-pass filter uses only resistors, capacitors, and active devices, is stable and has filter characteristics equivalent to an LC band-pass filter. A known band-pass amplifier comprises an operational amplifier and a negative feedback tuneable RC band reject network, such as a twin-T or bridged-T notch filter, or parallel high- and low-pass filters. To this is added a positive feedback circuit including an adjustable attenuator (for Q control) and a series feedback capacitor, and also a series input capacitor, that are effectively tuned to resonance at the band reject network center frequency. The positive feedback circuit thus has inductive characteristics at the passband frequencies, with resulting Q enhancement. The pass bandwidth and center frequency or high- and low-pass frequencies are tuneable independently and electronically by preferably fabricating the attenuator and band reject network in distributed RC form using insulated gate field effect transistors.

8 Claims, 10 Drawing Figures

Inventor:
James R. Whitten,
by Donald R. Campbell
His Attorney.

Inventor:
James R. Whitten,
by Donald R. Campbell
His Attorney.

Inventor:
James R. Whitten,
by Ronald R. Campbell
His Attorney.

Inventor:
James R. Whitten,
by Donald R. Campbell
His Attorney.

Inventor:
James R. Whitten.
by Ronald R Campbell
His Attorney.

TUNEABLE MICROELECTRONIC ACTIVE BAND-PASS FILTER

This invention relates to microelectronic or integrated circuit band-pass filters, and more particularly to microelectronic band-pass amplifiers that are tuneable as to operating frequency and bandwidth. These active electrical filters are stable and have band-pass filter characteristics with steep attenuation characteristics out of the passband and high adjacent channel attenuation properties.

Although LC band-pass filters with various arrangements of inductors and capacitors are desirable filters for many applications, they cannot be economically manufactured as monolithic or hybrid integrated circuits. This is because integrated circuit batch processes and microelectronic fabrication techniques in general cannot realize inexpensive inductors for such circuits. Microelectronic filters using RC components are possible, on the other hand, but have undesirable frequency response characteristics that make them not completely satisfactory. The present invention is directed to an active band-pass filter in which the RC circuit is incorporated in a feedback loop of an amplifier, as is well known in the art, the amplifier being required because of losses in the resistive elements. Active filters utilizing amplifying devices and combinations of resistors and capacitors, and possibly also inductors, have been unstable because the filter characteristics are dependent on the gain of the amplifying devices. Furthermore, these types of prior art active filters have failed to achieve a sharply selective frequency response equivalent to that of LC band-pass filters, that is, RC filter characteristics do not achieve steep attenuation of the input signals below the half power or −3 db. point and attendant high adjacent channel rejection properties. In addition, improvements can be made in microelectronic band-pass amplifiers by reason of the newer components now available, in particular the insulated gate field effect transistor, and in the tuneability features of the active filter.

Accordingly, an object of the invention is to provide an improved microelectronic band-pass filter using only resistors, capacitors, and active devices in circuit configurations to achieve an effective inductance over a band of frequencies and obtain a filter characteristic similar to that of an LC band-pass filter.

Another object is the provision of a tuneable band-pass amplifier, manufacturable in microelectronic or integrated circuit form, with steep attenuation characteristics out of the passband and high adjacent channel attenuation properties.

Yet another object is an improved, low-cost, wide frequency range, active band-pass filter of the foregoing type employing distributed resistance and capacitance components, and that is separately tuneable, electronically or otherwise, as to bandwidth and center frequency or band limits.

In accordance with the invention, the new tuneable microelectronic active band-pass filter comprises an amplifier having a substantially constant gain over a selected frequency range, such as an operational amplifier, and a negative feedback circuit including a tuneable frequency selective network that is made of only resistive and capacitive components and has a rejection band within the selected range of frequencies. To this band-pass amplifier is added a positive feedback circuit, made only of resistive and capacitive components, including the series combination of an adjustable attenuator (for Q control) and a feedback capacitor. An input capacitor is effectively coupled to the amplifier and the positive feedback circuit, and the combination of the input capacitor and positive feedback circuit is effectively tuned to resonance at a frequency within the rejection band of the degenerative frequency selective network, whereby the positive feedback circuit has inductive characteristics at the passband frequencies. This results in enhanced Q and a resonant increase in output. The pass bandwidth and center frequency or band limits are tuneable independently by respectively adjusting the attenuator and tuning the frequency-selective network.

In the preferred embodiments, the frequency-selective network is an equivalent twin-T or bridged-T notch filter, or a cascaded high-pass filter and low-pass filter fabricated in distributed RC form using insulated gate field effect transistors. The attenuator likewise includes a variable resistor provided by an insulated gate field effect transistor. By changing the gate-to-substrate voltage, the channel resistance is adjusted to effect tuning. The center frequency and Q enhancement are thus controlled electronically by control voltages, and in the case of the embodiment using parallel high- and low-pass filters in the degenerative circuit, the high-pass and low-pass frequencies are tuneable separately.

The foregoing and other objects, features, and advantages of the invention will be apparent from the following more particular description of several preferred embodiments of the invention, as illustrated in the accompanying drawings wherein.

Figure 6A:
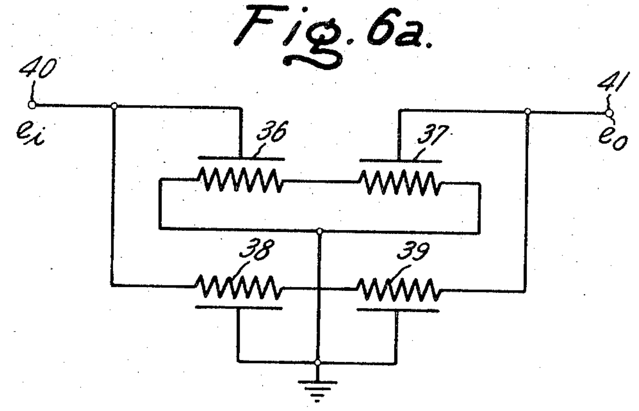
Figure 6B:
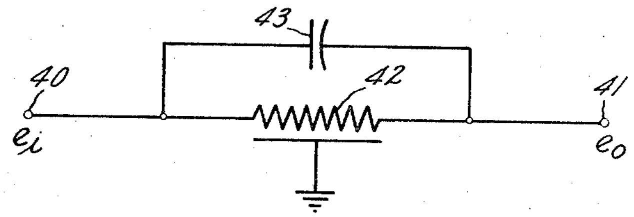
Figure 7:
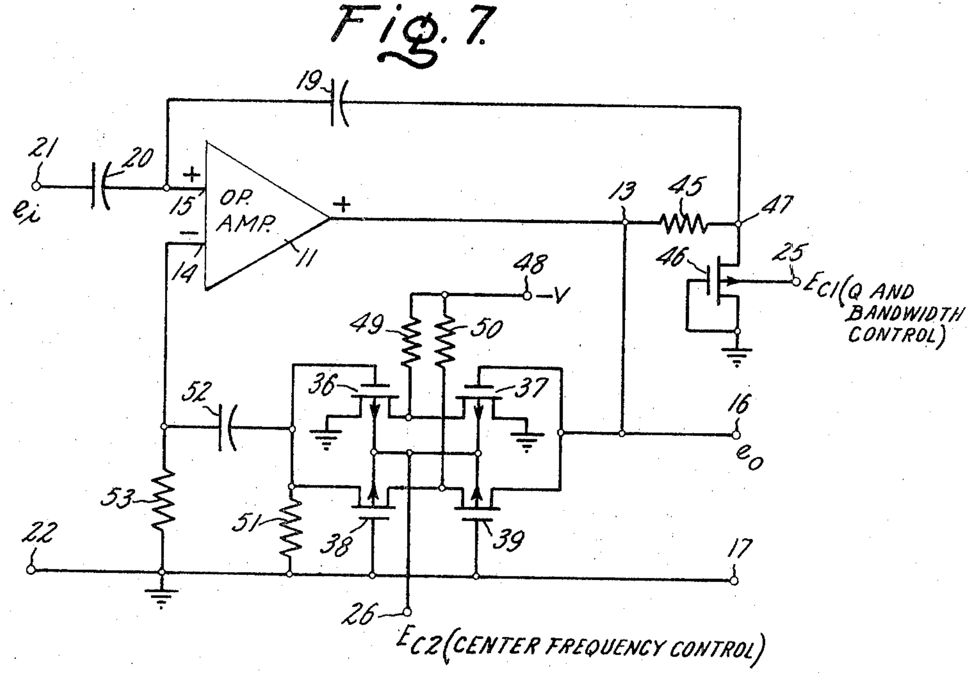
Figure 8:
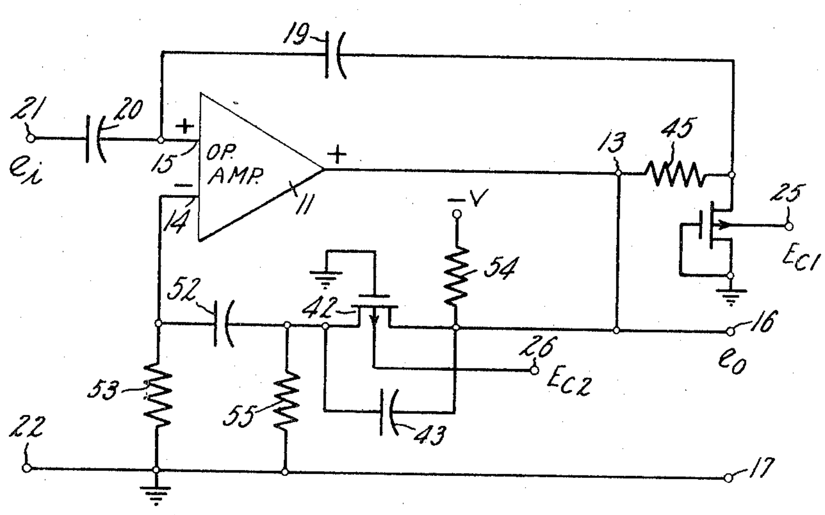
Figure 9:
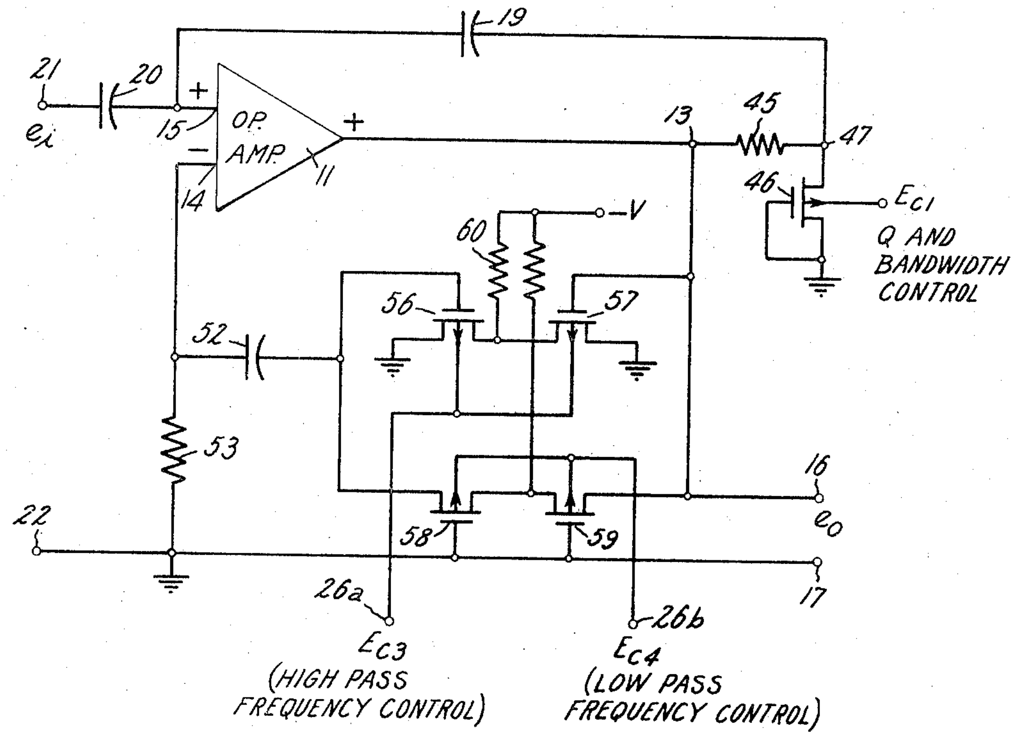

FIGS. 6*a* and 6*b* are diagrams of distributed RC band rejection filters built with insulated gate field effect transistors;

FIG. 7 is a detailed schematic circuit diagram of one preferred embodiment of the microelectronic band-pass amplifier implemented with a negative feedback loop of the type shown in FIG. 6*a*, which is electronically tuneable as to both center frequency and bandwidth;

FIG. 8 is a detailed schematic circuit diagram of a second preferred embodiment of the invention employing the band rejection filter of FIG. 6*b*; and FIG. 9 is a detailed schematic circuit diagram of a third preferred embodiment employing a band rejection filter made with insulated gate field effect transistors that comprises a high-pass filter and a low-pass filter connected in parallel, and which therefore has separate adjustment of the high- and low-pass frequencies as well as the bandwidth.

Figure 1:
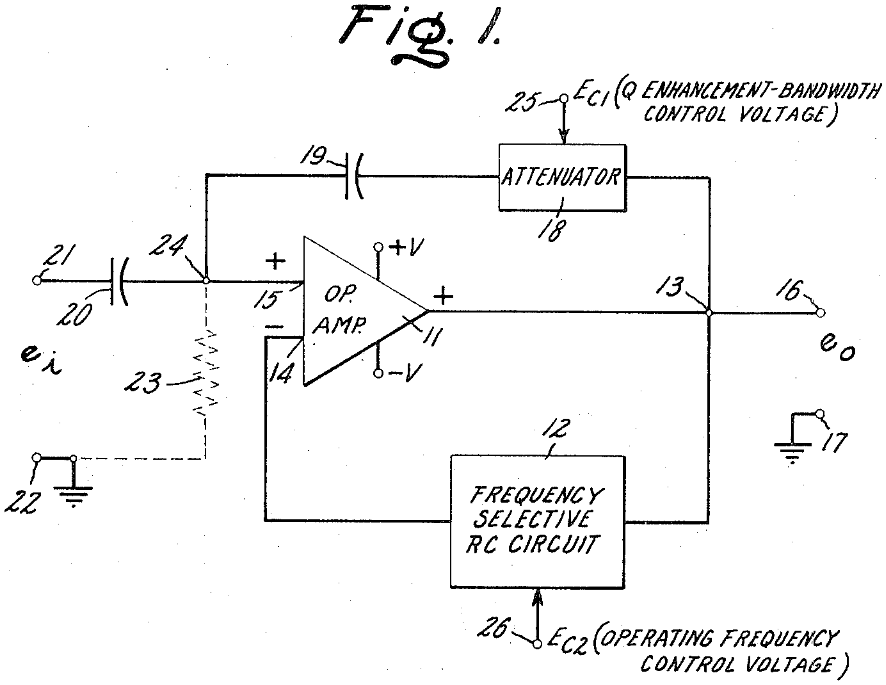
FIG. 1 is a block diagram of the basic components of the new microelectronic band-pass filter constructed in accordance with the invention.

The active band-pass filter shown in FIG. 1 comprises an operational amplifier 11 having a frequency-selective RC circuit 12 connected in a negative feedback loop between the output terminal 13 of the operational amplifier and the inverting input 14. Frequency selective RC circuit 12 is more particularly a band rejection filter that preferably, though not necessarily, has a notch filter characteristic. Operational amplifiers are commonly manufactured as integrated circuits, are characterized by a flat response, high gain, and a wide passband, and frequently have phase-gain characteristics that allow for a strong negative feedback around the amplifier. The operational amplifier has differential inputs including a noninverting input 14, and the output signal is the product of the error signal between the differential inputs and the gain of the amplifier. For this application, operational amplifier 11 has a high-input impedance and a low-output impedance. Within the scope of the invention, any amplifying device with essentially these characteristics can be substituted for the operational amplifier, preferably fabricated as a monolithic or hybrid integrated circuit, or by other microelectronic processes such as thin film and thick film processes.

Within the band of frequencies that are rejected by frequency-selective circuit 12, no voltage or a highly attenuated voltage is fed back through the negative feedback loop from the amplifier output 13 to the input 14, and the normal gain of amplifier 11 is obtained. At frequencies above and below the rejection band, however, the voltage fed back through the degenerative network is applied to amplifier input 14 with such a phase relation with respect to the signal voltage applied to noninverting amplifying input 15 that a reduction in gain is produced. Consequently, only those frequency components of the input signal $e_i$ that are within the rejection band of frequency selective circuit 12 appear without significant attenuation as output signal $e_o$ at the filter output terminals 16 and 17. The well-known band-pass amplifier comprising only operational amplifier 11 and frequency-selective RC circuit 12 in a negative feedback path is desirable, in the context of the invention, because it can be made as an integrated or microelectronic circuit since it comprises only resistors, capacitors, and transistor components. The usefulness of the circuit is limited, however, because it is not sharply selective, i.e., its out-of-band frequency response characteristics are not steeply sloped.

An important feature of the invention is that an improved RC band-pass amplifier with LC band-pass characteristics is formed by adding a positive feedback loop and a series input capacitor to the previously described band-pass amplifier comprising the operational amplifier 11 and frequency-selective circuit 12 in a negative feedback loop. The positive feedback circuit includes the series combination of an attenuator 18 and a feedback capacitor 19 connected between output terminal 13 and noninverting input terminal 15 of operational amplifier 11. The series input capacitor 20 is connected directly between noninverting input 15 and one input terminal 21. The other input terminal 22 is preferably grounded and is connected through a resistor 23 to the junction point between the two capacitors 19 and 20. Resistor 23 is shown in dotted lines since it represents the losses in the input circuit and in the positive feedback loop. The positive feedback circuit comprising attenuator 18 and feedback capacitor 19 operates to provide at junction point 24 an effective inductance over the band of frequencies for which the band-pass amplifier composed of operational amplifier 11 and frequency selective circuit 12 provides gain. When the circuit components and operating conditions are selected in the manner to be explained in detail later, the positive feedback loop with inductive characteristics forms with series input capacitor 20 a series resonant circuit which, like an ordinary series resonant LC circuit, is tuned to provide an enhanced Q and a resonant increase in output voltage. By providing the frequency-selective circuit 12 in the negative feedback loop of the band-pass amplifier, this resonant effect is effective only within the rejection band of the frequency-selective circuit.

To repeat, the inclusion in the band-pass amplifier of a positive feedback path with inductive characteristics makes possible the enhancement or multiplication of the overall circuit Q. As a result of the Q enhancement, the active filter of FIG. 1 has a considerably sharper frequency response than the prior art band-pass amplifier comprising only the operational amplifier 11 and frequency-selective circuit 12. The Q multiplication both increases output and narrows the bandwidth. Consequently, the out-of-band frequency response characteristic is much improved, with steep attenuation of the input signal frequencies out of the passband and attendant high adjacent channel attenuation properties.

Another feature of the invention is that the Q enhancement circuitry does not affect the center frequency or band limits of the resulting band-pass characteristic. There is consequently separate and independent adjustment of the Q enhancement, which tunes the pass bandwidth, and of the operating or center frequency of the active filter. Preferably the adjustment or tuning is done electronically by means of DC control voltages. Thus, attenuator 18 has a tuning terminal 25 to which is applied a Q enhancement control voltage $E_{c1}$, while to tune frequency-selective circuit 12, a band-pass frequency control voltage $E_{c2}$ is applied to terminal 26. The circuit frequency stability is determined only by the frequency-selective RC network 12 in the negative feedback path, and the operating or center frequency is tuned exclusively by the frequency-selective network by adjusting the values of the resistors and capacitors comprising the frequency-selective circuit 12, or only some of these components. In summary, the Q enhancement features allows frequency selectivity (i.e., high Q) to be determined primarily by the positive feedback circuit comprising attenuator 18 and feedback capacitor 19, which acts independently of the negative feedback circuit comprising frequency selective circuit 12. The negative feedback circuit exclusively determines the center frequency or the band limits of the passband characteristic. Therefore, requirements on the negative feedback circuit, which are extremely severe if it is to provide a high Q, are reduced and greatly simplifies its design.

Figure 2:
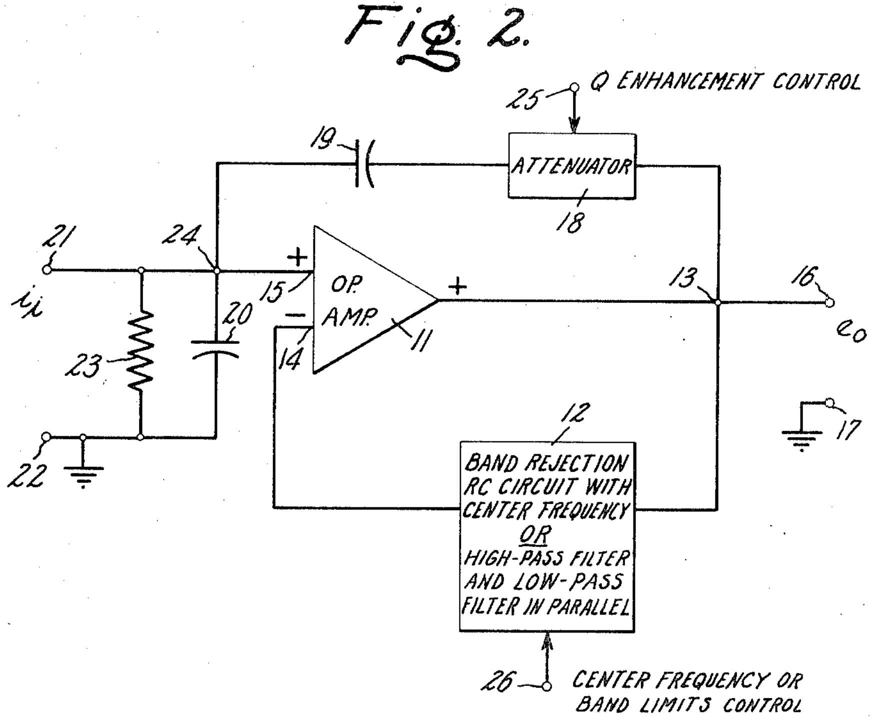
FIG. 2 is a modification of FIG. 1 suitable for an input current signal rather than a voltage signal.

FIG. 2 is a modification of the diagrammatic circuit of FIG. 1, and illustrates the input circuit for a current signal source $i_i$ applied to input terminals 21 and 22, as opposed to the voltage signal source $e_i$ in FIG. 1. For a current source, resistor 23 appears connected between input terminals 21 and 22, and input capacitor 20 is connected in parallel with resistor 23. Thus, the two alternatives as to the input circuit are a series capacitor to a voltage source, or a shunt capacitor to a current source. FIG. 2 also shows the two alternatives for frequency-selective RC circuit 12 mentioned herein. Ordinarily, this circuit is a band rejection notch filter with a center frequency that balances in the nature of a bridge about the center frequency, however FIG. 9 shows a high-pass filter in parallel with a low-pass filter to determine the band limits of the rejection band. FIG. 2 further illustrates that the Q enhancement control and the center frequency or band limit control need not be electronic in the general case, but can be other types of control signals such as mechanical or optical signals.

Figure 3:
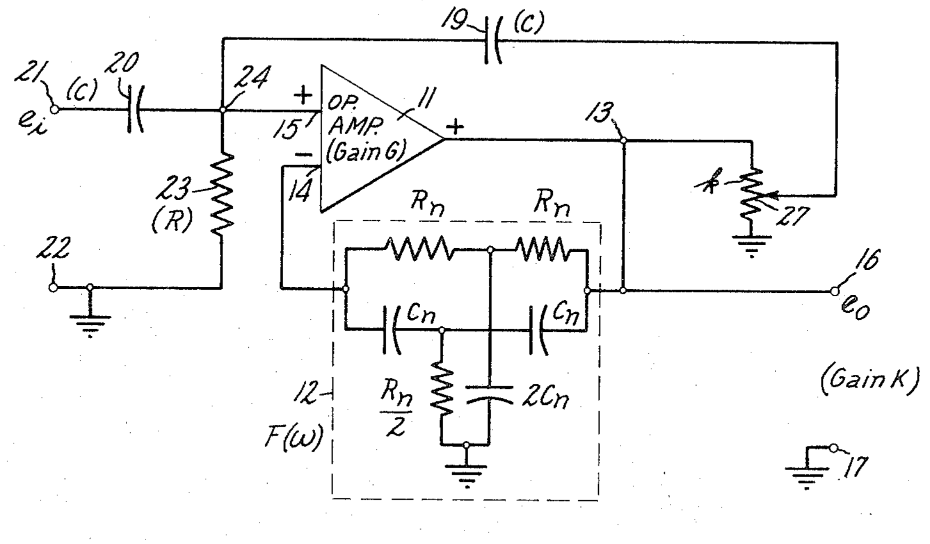
FIG. 3 is a schematic circuit diagram of a band-pass amplifier designed with lumped resistors and capacitors according to the block diagram of FIG. 1, that is useful in explaining the principles of the invention.

FIG. 3 is useful in further explaining the principles of the invention, and is a detailed circuit diagram of an active band-pass filter constructed in accordance with the block diagram of FIG. 1 utilizing lumped resistor and capacitor components in the feedback loops. Frequency selective circuit 12 in the negative feedback path is illustrated as being a twin-T or parallel-T RC band reject circuit. This well-known degenerative network is advantageous in that it is a three terminal network, one terminal of which may be grounded, that balances in the nature of the bridge to provide a notch characteristic with a theoretically zero transmission at the balance frequency. This circuit, of course, has an all-pass characteristic except at the center frequency and adjacent to the center frequency. For the values of the resistors and capacitors given in FIG. 3, the null or center frequency $\omega_o = 1/R_n C_n$, and the center frequency is changed by adjusting $R_n$ or $C_n$ or both of these. The attenuator in the positive feedback circuit is provided by a potentiometer 27 having an attenuation factor $k$. By connecting the resistive element of potentiometer 27 between amplifier output terminal 13 and ground, and feedback capacitor 19 directly between the moveable pointer of potentiometer 27 and junction point 24, and adjustable voltage is supplied to the positive feedback circuit. Feedback capacitor 19 and series input capacitor 20 in this circuit are chosen to be equal and to have a capacitance value C, in which case the product Kk, where K is the overall circuit gain, is selected to be 2 in order that the circuit have resonant properties.

Figure 4:
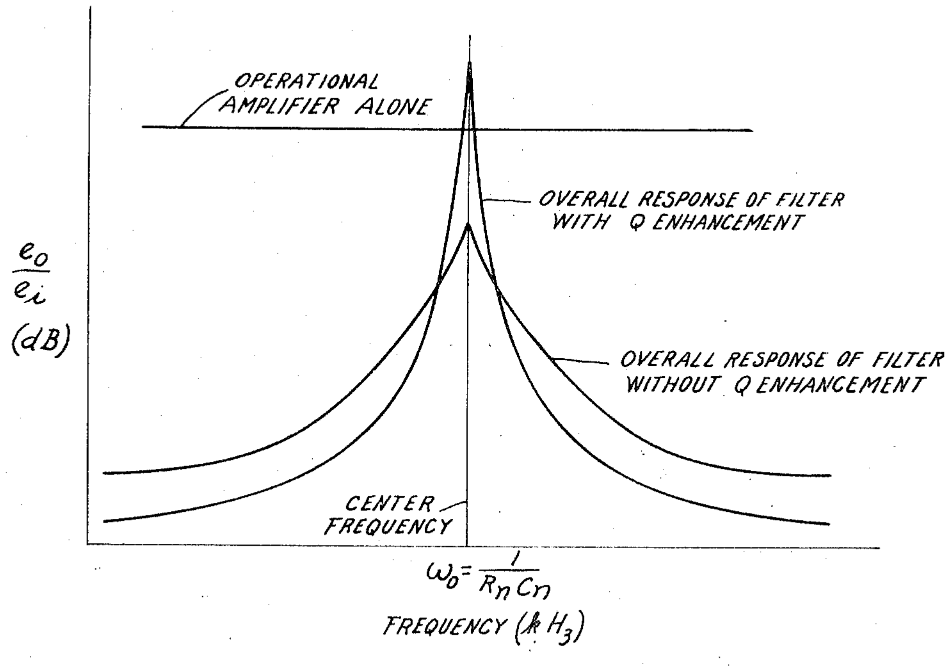
FIG. 4 illustrates frequency response characteristics, $e_o/e_i$ vs. frequency, of the FIG. 3 circuit for the operational amplifier alone, the overall filter response without Q enhancement, and the overall filter response with Q enhancement.

The effect of the Q enhancement is shown graphically in FIG. 4, wherein the ratio of circuit output voltage $e_o$ to the input voltage $e_i$ (in db.) is plotted as a function of frequency. The operational amplifier alone has high gain and a flat response over the frequency range of interest. The overall response of the filter without Q enhancement is a broadly sloping, symmetrical characteristic centered about the center frequency of twin-T band reject circuit 12. By adding the positive feedback loop and series capacitor, the overall response of the filter with Q enhancement is a more sharply sloped characteristic with both increased output and narrowed bandwidth. The peak value of $e_o/e_i$ for the circuit with Q enhancement theoretically rises above that of the operational amplifier alone, but in practice, to allow for variations in the values of the components, the peak value would be designed to be below that of the operational amplifier alone. The half power points are, of course, well within the narrowed portion of the characteristic.

The manner in which the RC band-pass amplifier with positive feedback provides a circuit with inductive characteristics between terminals 24–22 can be demonstrated by mathematical analysis of the circuit. This analysis also shows the relation between the overall circuit voltage gain $K=e_o/e_i$ and the relative values of capacitors 19 and 20 to obtain resonance. In FIG. 3, capacitors 19 and 20 are assumed to be equal and to have the value C, resistor 23 is assumed to be infinite, while $K$ is 10 and the attenuation constant $k$ is 0.2. At junction point 24 the impedance is $Z_{24}=e_{24}/i_{24}$, and $$i_{24}\Bigg|_{\omega=\omega_0} = \frac{e_{24}-Kke_{24}}{1/j\omega_oC_{19}} = e_{24}(1-Kk)j\omega_oC_{19}. \qquad (1)$$

Then, since $K=10$ and $k=0.2$, $$Z_{24}\Bigg| = \left(\frac{1}{1-Kk}\right)\frac{1}{j\omega_oC_{19}} = \frac{-1}{j\omega_oC_{19}}. \qquad (2)$$

At input terminal 21, for $C_{19}=C_{20}=C$, $$Z_{21}=\frac{1}{j\omega_oC_{20}}-\frac{1}{j\omega_oC_{19}}=\frac{1}{j\omega_oC}-\frac{1}{j\omega_oC}=0. \qquad (3)$$

The impedances of the series input capacitor and positive feedback circuit at the resonant frequency $\omega_o$ are, then, equal in magnitude and opposite in sign. The effect is that of a series LC circuit which has resonant properties over the band of frequencies where gain is provided by the band-pass amplifier composed of operational amplifier 11 and the twin-T negative feedback path. The overall circuit voltage gain $K$ can have values other than 10. For example, if $K=11$ and $k=1$, equation (2) is $$Z_{24}=\frac{1}{-10}\frac{1}{j\omega_oC_{19}}, \qquad (4)$$

and $C_{20}=C_{19}/10$ for resonance. It will further be noted that inversion of the reactance of feedback capacitor 19 is accomplished at whatever frequency a product $Kk$ of 2 is provided, as previously explained (for the circuit in which capacitors 19 and 20 are equal). Therefore, an easily tuneable band-pass characteristic equivalent to an LC circuit is obtained.

The enhancement $Q$ of the FIG. 3 circuit at midband is given by:

$$Q=\omega_oRC. \qquad (5)$$

The Q can be made high, as for example 10 to 100, with resulting sharp frequency selectivity. By changing the attenuation constant $k$ to a value less than 1 by adjustment of potentiometer 27, the positive feedback voltage is reduced and the circuit Q is also reduced, resulting in broader frequency selectivity. Thus, the bandwidth of the filter is adjustable. Mathematical analysis of the circuit further proves that the $Q$ enhancement control is independent of the center frequency adjustment of frequency-selective circuit 12. This is of major consequence to the design of frequency-stable active filters.

The conditions for stability of the enhanced $Q$ band-pass amplifier will be stated after the key equations in their derivation are presented. For the prior art band-pass amplifier comprising only operational amplifier 11 and frequency-selective circuit 12, identified in general terms as $F(\omega)$, $$\frac{e_o}{e_i}=\frac{G}{1+GF(\omega)}=G'. \qquad (6)$$

Negative feedback, as is well known, stabilizes the gain and reduces the effect of variation in G. For the FIG. 3 circuit with added positive feedback, assuming that capacitors 19 and 20 are equal, $$\frac{e_o}{e_i}=\frac{j\omega C}{\frac{1}{R}+j\omega C(2-G'k)}G'. \qquad (7)$$

Normalizing the complex denominator yields $$\frac{e_o}{e_i}=\frac{\omega^2R^2C^2(2-G'k)+j\omega RC}{1+\omega^2R^2C^2(2-G'k)^2}G'. \qquad (8)$$

Since the effective resistance term $\omega^2R^2C^2(2-G'k)$ is negative if $(2-G'k)$ is less than zero, and the circuit may oscillate and be unstable if there is negative effective resistance, the constraint for stability is that $$(2-G'k)\geq 0. \qquad (9)$$

Under ideal conditions $(2-G'k)=0$, but since $G'k$ is approximately zero well beyond the passband, the constraint in a practical circuit is that $$0\leq 2-G'k\leq 2. \qquad (10)$$

At the center frequency $\omega_o$ the parameter $(2-G'k)$ has a least upper bound $e$, obtained by designing the operational amplifier to have a gain variation within 10 percent or so (as a function of power supply, temperature, etc.) and the attenuation to have a constant value of attenuation. It can be shown that the maximum value of overall circuit gain is:

$$\frac{e_o}{e_i}=\frac{Q(Qe+j)}{1+Q^2e^2}G', \qquad (11)$$

where $Q=\omega RC$. By making $Qe$ small as compared to one, the circuit is insensitive to variation in $e$. For instance, when $Q=10$, and $e$ is between 0 and 0.05, equation (11) is relatively insensitive to the two values of $e$. This is a preferred condition for stability. The effective $Q$ may be adjusted by decreasing the value of $k$. At the resonant frequency and for the value $G'k$=in which case $e=0$, equation (11) yields $(e_o/e_i)=10jG'$. For the value $k=0$ in which case $e=2$, equation (11) yields $(e_o/e_i)\approx(G'/2)$. These examples show the extreme conditions for adjustment of $k$ and values intermediate to these will provide intermediate values of effective $Q$.

A particularly desirable component in realizing the microelectronic integrated circuit version of the new active band-pass filter is the insulated gate field effect transistor. As has been explained, adjusting the values of the resistor in the parallel-T band rejection circuit, or one resistor in each branch, changes the center frequency $\omega_o$. The center frequency is also adjusted by changing the values of the capacitors, either exclusively or in conjunction with the adjustment of the resistors, but it is considerably more difficult at present to change the capacitance value of a capacitor. There is the further limitation that the values of the capacitors in FIG. 3, including feedback capacitor 19 and series input capacitor 20, be relatively small in the range of about 100 to 1,000 picofarads or less, since large values of capacitance are expensive to provide in current manufacturing process technology. The advantage of the metal-oxide-semiconductor field effect transistor, and other types of insulating gate field effect transistors, is that these devices have high-input impedance and low input capacitance. These transistors make possible RC circuits for providing frequency selectivity that are not possible using bipolar devices whose low-input impedance requires large values of capacitance. It is evident that the insulated gate field effect transistor is a form of distributed R and C, and RC circuits made in distributed form offer improved compatibility with silicon monolithic or hybrid, thick film, and thin film manufacturing process technology. A further advantage of the insulated gate field effect transistor is that it can be tuned electronically. Within the broad scope of the invention, however, other variable R or C components may be used to tune or adjust the frequency of the feedback network such as transistors operated as variable resistors, reverse biased junctions such as varicap capacitors, strain gages, or other devices.

Frequency selective distributed RC networks can be constructed with any of the various types of insulated gate field effect transistors, such as the metal-oxide-semiconductor field effect transistor, commonly known as the ordinary MOS transistor, and those transistors which utilize a refractory metal diffusion mask, known as RMOS transistors. The common MOS transistor is a silicon device with a silicon dioxide gate insulator, however there are variations in which the insulator is a laminate, such as laminate of silicon dioxide and silicon nitride. The refractory type or self-aligned field effect transistors have a similar type of gate insulator and an overlying conductive layer of polycrystalline silicon, molybdenum, or tungsten that serves as a diffusion mask during the diffusion of the conductivity modified source and drain electrodes. Any of these insulated gate field effect transistors, whether P-channel or N-channel, or whether operated in the enhancement of depletion mode, are suitable for the practice of the invention.

Figure 5:
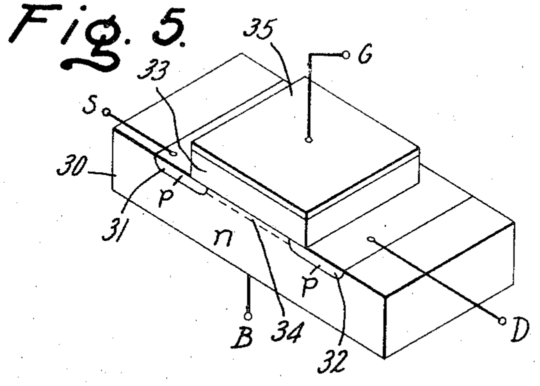
FIG. 5 is a diagrammatic isometric view of an insulated gate field effect transistor, the form of distributed RC employed in the preferred embodiments of the invention.

To clarify the structure and operation of the insulated gate field effect transistor used as a distributed RC component, FIG. 5 illustrates a P-channel, enhancement mode, metal-oxide-silicon field effect transistor. The bulk or substrate 30 is N-type silicon with a terminal B. The source and drain electrodes 31 and 32, respectively, comprise heavily doped P-type regions, formed usually by a diffusion process, at and adjacent to the surface of the substrate 30. Metallic contacts, not shown, are deposited on the drain and source and connected, respectively, to terminals S and D. The gate insulator layer or layers 33 overlies the channel 34 and partially overlaps both the source and drain electrodes 31 and 32. Gate contact metallization 35 overlies gate insulator 33 and is a refractory metal in the RMOS type of field effect transistor. Gate terminal G makes connection with contact metallization 35. In operation, assuming that a DC voltage of the appropriate polarity is connected between source and drain terminals S and D, the device is changed from its nonconducting to its conducting state when a negative voltage exceeding the threshold voltage is applied between gate and substrate terminals G and B. An electric field is created in gate insulator 33, and that portion of the electric field which exists in substrate 30 attracts holes from the body of the substrate toward its surface, creating P-channel 34 by the process of inversion. The previous PNP configuration is changed to a PPP configuration, and a current passes between source and drain electrodes 31 and 32.

The channel resistance of an insulated gate field effect transistor, as is known, is voltage variable by changing the gate-to-substrate voltage. As the gate is biased more negative relative to the bulk, more holes are drawn toward the surface of the bulk, and the conductivity increases. With a low value of gate-to-substrate voltage, just exceeding the threshold, the channel conductivity is at its lowest value. Although there is some change in gate-to-channel capacitance as the gate-to-substrate voltage is adjusted, this is a second order effect. Of course, the dimensions of the device are selected during manufacture to obtain the desired gate-to-channel capacitance and the desired range of channel resistance.

FIG. 6*a* is a circuit diagram of the twin-T RC band reject circuit 12 shown in FIG. 3 implemented in distributed RC form using MOS transistors. The MOS transistors are illustrated in diagrammatic form to depict the channel resistance and the gate-to-channel capacitance of the device. The equivalent twin-T band rejection circuit comprises four MOS transistors 36–39 connected in symmetrical pairs between input and output terminals 40, 41 and ground. The gates of transistors 36 and 37 are connected respectively to the input and output terminals, while the channels are series connected and returned to ground. This corresponds to the branch of the twin-T circuit having two series capacitors and a resistor coupled between their junction and ground. Transistors 38 and 39 provide the other branch in which there are two series resistors and a capacitor coupled between their junction and ground. FIG. 6b illustrates another type of RC band reject filter constructed of only one MOS transistor 42 and one capacitor 43 connected in parallel with the channel between the source and drain electrodes. The circuit is commonly called a bridged-T band reject circuit and in lumped RC form comprises two series resistors having a capacitor connected between their junction and ground, with the capacitor 43 in parallel with the two series resistors. The advantage of this circuit is equivalent distributed RC form using MOS transistors is that the circuit can be tuned by adjustment of only one device, i.e., by changing the channel resistance to tune the circuit by charging the value of the series resistor.

FIG. 7 is a detailed circuit diagram of a microelectronic or integrated circuit active band-pass filter incorporating positive feedback for Q enhancement, and featuring separate electronic control of the circuit Q and the center frequency of the band reject notch filter in the negative feedback path. This filter uses as a band reject circuit in the negative feedback loop the distributive RC form of the twin-T network illustrated in FIG. 6*a*. Operational amplifier 11 is any suitable microelectronic integrated circuit operational amplifier, such as the RCA CA3030 or the Fairchild UA709 operational amplifier. The latter component made by the Fairchild Camera and Instrument Corporation is described in detail in *Electronics* magazine, Oct. 16, 1967, pp. 86–91. The attenuator in this circuit is also in a form suitable for fabrication by microelectronic or integrated circuit techniques, and comprises a resistive voltage divider including a fixed resistor 45 in series with the source-to-drain conducting path of a MOS transistor 46 operated as a variable resistance. The gate and source of transistor 46 are tied together to ground, and the channel resistance is varied by means of the Q control voltage $E_{c1}$. Feedback capacitor 19 is, of course, connected between junction 47 of the resistor divider and noninverting amplifier terminal 15. Feedback capacitor 19 and series input capacitor 20 preferably have the same capacitance value, in the order of about 100 to 1,000 picofarads, and the product of gain $K$ and attenuation $k$ are adjusted to 2 in order that, as previously explained, the positive feedback circuit and input capacitor 20 be tuned to resonance.

The parallel-T distributed RC band reject circuit composed of MOS transistors 36–39, connected in pairs between amplifier terminal 13 and inverting input terminal 14, is functionally equivalent to the representation of the circuit in FIG. 6*a*. To provide for power supply and bias functions, a supply terminal 48 connected to a source −V is coupled through a bias resistor 49 to the junction of the drain electrodes of transistors 36 and 37, and through a second bias resistor 50 to the junction of the drain electrodes of the other pair of transistors 38 and 39. As in FIG. 6*a*, the gate of transistor 37 is tied to the source of transistor 39 and to amplifier terminal 13. In like manner the gate of transistor 36 is tied to the source electrode of transistor 38, and both are connected to ground through a bias resistor 51, and through a DC blocking capacitor 52 to inverting amplifier input 14. Amplifier input 14 is also connected through a bias resistor 53 to ground. Center frequency adjustment is obtained by connecting together the substrate terminals of all four MOS transistors 36–39. By applying a center frequency control voltage $E_{c2}$ to terminal 26, the gate-to-substrate voltage of all four transistors, and hence the channel resistance of each transistor is changed. In the lumped version of the twin-T circuit in FIG. 3 this amounts to changing the values of all three resistors by like proportional amounts. In this manner the center frequency of the equivalent twin-T band rejection circuit is tuned.

By way of brief review of the operation of the tuneable microelectronic active band-pass filter shown in FIG. 7, the center frequency is selected by applying the proper magnitude of control voltage $E_{c2}$ to terminal 26, and the pass bandwidth is independently selected by applying a Q control voltage $E_{c1}$ of the proper magnitude to terminal 25 to select the Q of the circuit. The active band-pass filter theoretically has a wide frequency range from a few cycles to tens of megacycles dependent only upon the frequency limitations of operational amplifier 11 and the various MOS transistors. The bandwidth adjustment range is expressed as a ratio of the center frequency to the bandwidth, and is adjustable in the range of about 2 to 50. By changing the channel resistance of MOS transistor 46 in the attenuator between its maximum and minimum values, the amount of feedback voltage in the positive feedback circuit is reduced, thereby reducing the Q of the circuit and increasing the pass bandwidth. In the negative feedback circuit, the center frequency and the frequency to either side of the center frequency are rejected while other frequencies are passed so that there is a degenerative voltage feedback which acts to reduce the gain of operational amplifier 11 at all frequencies except at the band reject frequencies. As was previously explained in detail, the positive feedback circuit comprising attenuator 45, 46, and feedback capacitor 19 has inductive characteristics that are effective only over a band of frequencies for which the band-pass amplifier provides gain. The effective inductance of the positive feedback circuit effectively forms with series input capacitor 20 a series resonant circuit equivalent to a series LC resonant circuit that can be effectively tuned to resonance to provide for increased output and enhanced $Q$. The resulting RC active band-pass filter has LC band-pass frequency response characteristics, and has frequency stability when operated to satisfy the conditions of equations (10) and (11). The separate and independent tuning of the center frequency and the pass bandwidth, which can be electronic, is a particular advantage of the new circuit, since it has been shown that the circuit components added to enhance the $Q$ do not contribute to the determination of the center frequency of the operating circuit.

FIG. 8 is a detailed circuit diagram of a second preferred embodiment of the microelectronic active band-pass filter. This circuit is similar to FIG. 7 with the exception that the frequency selective circuit in the negative feedback path is provided by the distributed RC notch filter illustrated in FIG. 6*b*. This equivalent bridged-T band rejection circuit comprises the single MOS transistor 42 and the bridging capacitor 43. The gate electrode is grounded, while the drain electrode is connected to amplifier terminal 13 and also through bias resistor 54 to a negative voltage source, and the source electrode is connected through a second bias resistor 55 to ground and also through a DC blocking capacitor 52 to inverting amplifier input 14. The application of a center frequency control voltage $E_{c2}$ to terminal 26 adjusts the gate-to-substrate voltage of transistor 42 and hence the channel resistance. The microelectronic band-pass filter of FIG. 8 has essentially the same advantages and operates in the same manner as the FIG. 7 circuit and need not be further explained.

The third preferred embodiment of the invention illustrated in FIG. 9 adds the feature that both the high-pass frequency and the low-pass frequency of the frequency-selective circuit in the negative feedback path are independently adjustable, in addition to the independent control of the bandwidth and the Q enhancement in the positive feedback circuit. The high-pass filter in the degenerative feedback network comprises two MOS transistors 56 and 57 connected in cascade. Similar to the arrangement of the transistors 36 and 37 in FIG. 7, the two source electrodes are grounded, the two drain electrodes are connected in common and to a voltage source $-V$ through a bias resistor 60, and the gate electrodes are connected to the input and output terminals of the filter. The equivalent circuit arrangement is similar to that of transistors 36 and 37 in FIG. 6*a*, in that the equivalent capacitors provided by the distributed RC elements are in series with one another while the equivalent resistance provided by the series connected channel resistances are in shunt. This, of course, defines a high-pass RC filter, and the cutoff frequency of the filter is adjusted by changing the gate-to-substrate voltage. The low-pass filter comprises the MOS transistors 58 and 59, which are connected in essentially the same manner as transistors 38 and 39 in FIG. 7. This arrangement (see also FIG. 6*a*) provides an equivalent circuit in which the series coupled channel resistances are connected between the input and output terminals of the filter, whereas the channel-to-gate capacitances are connected in shunt. This defines a low pass RC circuit in which the cutoff frequency is adjusted by controlling the gate-to-substrate voltage. The high-pass filter comprising transistors 56 and 57 is effectively connected in parallel circuit relationship with the low-pass filter comprising transistors 58 and 59, and in order to provide independent adjustment, the substrates of transistors 56 and 57 are connected to tuning terminal 26*a* whereas the substrates of transistors 58 and 59 are connected to a separate tuning terminal 26*b*. By applying separate control voltages $E_{c3}$ and $E_{c4}$ to these two band limit control terminals, independent adjustment of each end of the pass bandwidth of the band-pass amplifier is obtained. The operation of the active band-pass filter of FIG. 9 is otherwise the same as that described for FIG. 7.

In summary, the new active band-pass filter made of only resistors, capacitors, and transistors is manufacturable by microelectronic or integrated circuit techniques and has sharply selective filter characteristics equivalent to those of an LC band-pass filter. An outstanding feature is the separate and independent tuneability of the bandwidth (through a Q control) and the center frequency or band limits of the passband. The improved band-pass amplifier comprises essentially a differential input amplifier; negative feedback to the amplifier through a frequency-dependent band reject circuit that determines the center frequency (or band limits) and the band edges to a first degree; positive feedback to the amplifier through a fixed attenuator which determines the Q enhancement and a series feedback capacitor to an input circuit; and an input circuit comprising a series capacitor to a voltage source, or a shunt capacitor to a current source. It is advantageous to implement the degenerative band reject network and the attenuator in distributed RC form using insulated gate field effect transistors, with the added feature that the channel resistance is adjustable by change of the gate-to-substrate voltage. Hence the operating frequency of the band reject network and the attenuation constant (to change the Q enhancement) are tuneable electronically.

While the invention has been particularly shown and described with reference to several preferred embodiments thereof, it will be understood by those skilled in the art that the foregoing and other changes in form and details may be made therein without departing from the spirit and scope of the invention.

What I claim as new and desire to secure by Letters Patent of the United States is:

1. A tuneable active band-pass filter comprising
 - an amplifier having a substantially constant gain over a selected frequency range,
 - an amplifier negative feedback circuit including a tuneable frequency-selective network that is formed only of resistive and capacitive components and has a rejection band within the selected frequency range,
 - an amplifier positive feedback circuit formed only of resistive and capacitive components and including the series combination of an adjustable attenuator and a feedback capacitor, and
 - an input capacitor coupled to said amplifier and also coupled to said positive feedback circuit to effectively form a series resonant circuit,
 - the combination of said input capacitor and positive feedback circuit being effectively tuned to resonance at a frequency within the rejection band of said frequency-selective network, whereby said positive feedback circuit has inductive characteristics at the passband frequencies and the active band-pass filter has steeply sloped filter characteristics.

2. A circuit as defined in claim 1 wherein said frequency-selective band rejection network has a center frequency, and further includes
 - control means for tuning the center frequency,
 - the combination of said input capacitor and positive feedback circuit being tuned to resonance at the center frequency.

3. A circuit as defined in claim 1 wherein said frequency-selective band rejection network comprises a high-pass filter and a low-pass filter, and
 - control means for independently tuning the high-pass frequency and the low-pass frequency of the respective high-pass and low-pass filters.

4. A circuit as defined in claim 3 wherein said frequency-selective network formed of only resistive and capacitive components is voltage controlled to change at least one of the effective resistance and capacitance, and said control means for independently tuning the high-pass frequency and the low-pass frequency are control voltages.

5. A tuneable microelectronic active band-pass filter comprising an operational amplifier having differential input terminals and an output terminal, and a substantially constant gain over a selected frequency range, a negative feedback circuit connected between the amplifier output terminal and one input terminal and including a tuneable frequency-selective network formed only of resistive and capacitive components that has a rejection band within the selected frequency range, a positive feedback circuit formed only of resistive and capacitive components that is connected between the amplifier output terminal and other input terminal and includes the series combination of an adjustable attenuator and a feedback capacitor, and an input capacitor effectively coupled in series circuit relationship with said positive feedback circuit to effectively form a series resonant circuit, the series combination of said input capacitor and positive feedback circuit being effectively tuned to series resonance at a frequency within the rejection band of said frequency-selective circuit, whereby said positive feedback circuit has inductive characteristics at the passband frequencies resulting in enhanced Q and steeply sloped filter characteristics.

6. A circuit as defined in claim 5 wherein said frequency selective band rejection network is formed at least partially of resistive and capacitive components in distributed form comprising insulated gate field effect transistors, and control means for tuning said frequency-selective network comprising at least one control voltage for varying the gate-to-substrate voltage of said insulated gate field effect transistors, and wherein said adjustable attenuator is a resistive voltage divider comprising a fixed resistor and an insulated gate field effect transistor, and control means for adjusting said attenuator comprising a control voltage for varying the gate-to-substrate voltage of said last-mentioned insulated gate field effect transistor.

7. A circuit as defined in claim 5 wherein said adjustable attenuator is a resistive voltage divider comprising an insulated gate field effect transistor, and said feedback and input capacitors have the same capacitance value, and the product of the overall circuit gain and attenuation constant is selected to have a value of two.

8. A circuit as defined in claim 5 wherein said frequency selective band rejection network comprises the parallel combination of a high pass filter and a low pass filter each constructed of at least one insulated gate field effect transistor, and means for independently tuning the high pass frequency and the low pass frequency comprising control voltages for independently varying the gate-to-substrate voltages of the transistors respectively forming said high pass filter and low pass filter.

* * * * *